United States Patent
Ismaeel et al.

(10) Patent No.: US 11,754,644 B2
(45) Date of Patent: Sep. 12, 2023

(54) MAGNETIC FIELD SENSORS, METHODS OF DETECTING A MAGNETIC FIELD, AND RELATED MAGNETICALLY RESPONSIVE LIGHT PROPAGATING COMPONENTS AND OPTICAL DEVICES

(71) Applicant: University of Southampton, Southampton (GB)

(72) Inventors: Rand Ismaeel, Highfield (GB); Ali Masoudi, Highfield (GB); Martynas Beresna, Highfield (GB); Gilberto Brambilla, Highfield (GB)

(73) Assignee: UNIVERSITY OF SOUTHAMPTON, Highfield Southampton (GB)

( * ) Notice: Subject to any disclaimer, the term of this patent is extended or adjusted under 35 U.S.C. 154(b) by 602 days.

(21) Appl. No.: 16/879,575

(22) Filed: May 20, 2020

(65) Prior Publication Data
US 2020/0348371 A1    Nov. 5, 2020

Related U.S. Application Data

(63) Continuation of application No. PCT/GB2018/053403, filed on Nov. 26, 2018.

(30) Foreign Application Priority Data

Nov. 24, 2017    (GB) ..................... 1719576

(51) Int. Cl.
*G01R 33/032*    (2006.01)
*G02F 1/00*    (2006.01)
(Continued)

(52) U.S. Cl.
CPC ....... *G01R 33/0322* (2013.01); *G02F 1/0036* (2013.01); *G02F 1/0136* (2013.01);
(Continued)

(58) Field of Classification Search
CPC . G01R 33/0322; G02F 1/0036; G02F 1/0136; G02F 1/093; G02F 1/0955; G02F 2202/06
(Continued)

(56) References Cited

U.S. PATENT DOCUMENTS

| 4,604,577 A * | 8/1986 | Matsumura ........... G02F 1/0036 359/324 |
| 4,762,384 A | 8/1988 | Hegarty et al. |

(Continued)

FOREIGN PATENT DOCUMENTS

WO    2010082932 A1    7/2010

OTHER PUBLICATIONS

Erol, Mustafa. Synthesis of garnet based films by sol-gel technique and investigation of their magneto-optic properties. Diss. DEÜFen Bilimleri Enstitüsü, 2009. (Year: 2009).*

(Continued)

*Primary Examiner* — Christopher P McAndrew
(74) *Attorney, Agent, or Firm* — Kilpatrick Townsend & Stockton LLP (57) ABSTRACT

A magnetic field sensor comprises a magnetically responsive light propagating component configured to cause a polarization of light propagating inside the component to be rotated in response to an applied magnetic field, wherein the magnetically responsive light propagating component is formed of a bulk material doped with a dopant, the dopant including at least gadolinium, the dopant concentration being at a sufficiently low concentration such that the dopant is uniformly dispersed in the bulk material to provide a high Verdet constant. The magnetic field sensor also comprises a detector, and a polarization-maintaining light input device to couple the light into the magnetically responsive light propagating component. The detector is configured to measure a
(Continued)

property of light output from the magnetically responsive light propagating component to determine a change in polarization of the light, the change caused by the presence of a magnetic field.

20 Claims, 2 Drawing Sheets (51) Int. Cl.
  *G02F 1/01* (2006.01)
  *G02F 1/09* (2006.01)
  *G02F 1/095* (2006.01)
(52) U.S. Cl.
  CPC ............ *G02F 1/093* (2013.01); *G02F 1/0955* (2013.01); *G02F 2202/06* (2013.01)
(58) Field of Classification Search
  USPC ...................................................... 324/244.1
  See application file for complete search history.

(56) References Cited

U.S. PATENT DOCUMENTS

| | | | | | |
|---|---|---|---|---|---|
| 5,043,231 | A | * | 8/1991 | Miyazawa | ............... C30B 29/28 359/324 |
| 5,053,617 | A | * | 10/1991 | Kakizaki | ................ G01R 15/24 374/161 |
| 5,477,376 | A | * | 12/1995 | Iwatsuka | .............. G01R 33/032 359/283 |
| 5,479,290 | A | * | 12/1995 | Tanno | ................... G02F 1/0036 359/324 |
| 5,483,161 | A | * | 1/1996 | Deeter | ............... G01R 33/0322 250/225 |
| 5,493,220 | A | * | 2/1996 | Oliver | ................ G01R 33/0325 356/35.5 |
| 5,635,830 | A | * | 6/1997 | Itoh | .................... G01R 33/0322 324/96 |
| 5,790,299 | A | * | 8/1998 | Wilson | .................... G02F 1/093 359/490.02 |
| 2003/0133657 | A1 | | 7/2003 | Kochergin et al. | |
| 2017/0227588 | A1 | | 8/2017 | Smith | |

OTHER PUBLICATIONS

Zheleznov, Dmitry S., et al. "Drastic reduction of heat release in magneto-optical elements: new ways toward a 100 kW average power Faraday isolator." Laser Optics 2006: Solid State Lasers and Nonlinear Frequency Conversion. vol. 6610. SPIE, 2007. (Year: 2007).*
Ismaeel, Rand, et al. "Giant Faraday rotation in gadolinium doped silica optical fibers for high performance optical isolators." Optical Fiber Communication Conference. Optical Society of America, 2018. (Year: 2018).*
Di Martino, et al., "Gd-Incorporation and Luminescence Properties in Sol-Gel Silica Glasses", Journal of Non-Crystalline Solids, vol. 354, No. 32, Aug. 15, 2008, pp. 3817-3823.
GB1719576.9, "Combined Search and Examination Report", dated May 3, 2018, 6 pages.
PCT/GB2018/053403, "International Search Report and Written Opinion", dated Apr. 2, 2019, 16 pages.
Sedlar, et al., "Optical Fiber Magnetic Field Sensors With Ceramic Magnetostrictive Jackets", Applied Optics, vol. 35, No. 27, Sep. 20, 1996, pp. 5340-5344.
Sun, et al., "Compact All-Fiber Optical Faraday Components Using 65-wt%-Terbium—Doped Fiber With a Record Verdet Constant of—32 Rad/(TM)", Optics Express, vol. 18, No. 12, Jun. 7, 2010, pp. 12191-12196.
Van Vleck, "Quantum Mechanics: The Key to Understanding Magnetism", Science, vol. 201, No. 4351, Jul. 14, 1978, pp. 113-120.
Yuan, et al., "Anomalous Dependence of Faraday Rotation on Doping Concentrations in Gd-doped Germanate Infrared Glasses", Journal of Applied Physics, vol. 70, No. 10, XP055541464, Nov. 15, 1991, pp. 6272-6274.

* cited by examiner

MAGNETIC FIELD SENSORS, METHODS OF DETECTING A MAGNETIC FIELD, AND RELATED MAGNETICALLY RESPONSIVE LIGHT PROPAGATING COMPONENTS AND OPTICAL DEVICES

CROSS-REFERENCES TO RELATED APPLICATIONS

This application claims priority to and is a continuation of International Patent Application No. PCT/GB2018/053403, filed Nov. 26, 2018; which claims priority from GB Patent Application No. 1719576.9, filed Nov. 24, 2017, the entire contents of which are hereby incorporated by reference in their entirety for all purposes.

TECHNICAL FIELD

The application relates to the technical field of magnetic field sensors. In particular, the application relates to magnetic field sensors incorporating magnetically responsive light propagating components formed to be usable as Faraday rotators, in particular in fiber form. The application also relates to other optical apparatus incorporating the magnetically responsive light propagating components.

BACKGROUND OF THE INVENTION

Magnetic field sensors have found numerous applications in a variety of fields including navigation, current sensing, space and geophysics. Many magnetic field sensors rely on techniques based on electronics, such as Hall-effect sensors, anisotropic or giant magnetoresistive devices, or superconducting quantum interference devices (SQUID). On the other hand, optical components and systems, particularly employing optical fibers, are an area of ongoing research and development, and are capable to providing desirable functionality to a wide range of applications, with many inherent advantages.

In this regard, optical fiber magnetic field sensors have found niche applications in current sensing because of their immunity to electromagnetic interference, low weight, small size, and remote operation. Many fiberized magnetic field sensors use magnetostrictive jackets which induce a strain or Lorentzian force on the fiber, which is in turn detected by optical means arranged to reveal the induced strain. An example arrangement is described in "Optical fiber magnetic field sensors with ceramic magnetostrictive jackets"; Sedlar M, Paulicka I, Sayer M.; Appl Opt. 1996 Sep. 20; 35(27): 5340-4. Yet, these kinds of sensor designs require relatively complex fabrication and thus result in a relatively expensive magnetic field sensing system, and are in particular not suitable for monitoring a magnetic field over a wide area.

Another simpler, more elegant approach to providing an optics-based magnetic field sensor could be to use an intrinsic property of the fiber to reveal the magnetic field. In this regard, a fiber that is configured to act as a Faraday rotator to rotate the polarization azimuth of linearly polarized light passing through it due to an applied magnetic field could provide such a sensing functionality.

Normal silica fibers only very marginally exhibit Faraday rotation and so require coiling with multiple turns to increase the rotation of the azimuth of the linearly polarized light as it travels through the coiled fiber. This results in large amounts of silica fiber, as much as hundreds of meters, being needed to provide the required magnetic field sensitivity, resulting in a bulky sensor system.

A fiber-based magnetic field sensor is known from "Compact all-fiber optical Faraday components using 65-wt %-terbium-doped fiber with a record Verdet constant of −32 rad/(Tm)," L. Sun, S. Jiang, and J. R. Marciante, Opt. Express 18, 12191-12196 (2010) in which a fiber is produced having a high dopant concentration of 65% by weight Terbium (Tb) doped fibers which gives a fiber that exhibits Faraday rotation ~30 times more than that of normal silica fibers. However, the high concentration of the terbium dopant creates a fiber that is difficult to work with as it requires special handling (for example, the fiber is difficult to splice due to a significantly different softening point compared to conventional silica fibers), is expensive to produce, and also causes the fiber to have high coupling and propagation losses, making use of these terbium-doped fibers impractical for use in fiber-based magnetic field sensor systems.

It is in this context that the subject matter contained in the present application has been devised.

BRIEF SUMMARY OF THE INVENTION

The present application discloses, in example embodiments, a magnetically responsive light propagating component configured to cause a polarization of light propagating inside the component to be rotated in response to an applied magnetic field. The magnetically responsive light propagating component is formed of a bulk material doped with a dopant, the dopant including at least gadolinium. The dopant concentration being at a sufficiently low concentration such that the dopant is uniformly dispersed in the bulk material to provide a high Verdet constant.

The present application discloses, in example embodiments, a magnetic field sensor comprising: a linearly polarized light source; a magnetically responsive light propagating component in accordance with one of the above-described embodiments, the magnetic field sensor being arranged so that, in use, linearly polarized light from the linearly polarized light source is coupled into the magnetically responsive light propagating component, the magnetically responsive light propagating component acting as a Faraday rotator to cause the polarization of the linearly polarized light propagating inside the component to be rotated in response to an applied magnetic field; and a detection device arranged to receive light output from the magnetically responsive light propagating component; wherein the detection device is configured to measure a property of light output from the magnetically responsive light propagating component to indicate a change in polarization of the light, the change caused by the presence of a magnetic field.

The present application discloses, in example embodiments, a method of detecting a magnetic field, the method comprising: receiving polarized light into a magnetically responsive light propagating component; detecting a property of light output from the magnetically responsive light propagating component to determine a change in polarization of the polarized light, the change in polarization being due to a magnetic field applied along the length of the magnetically responsive light propagating component.

In some embodiments, the dopant may consist essentially or exclusively of gadolinium.

In some embodiments, the bulk material may consist of amorphous fused silica.

In some embodiments, the bulk material may consist of at least one of: germanosilicate, aluminosilicate, flurosilicate and phosphosilicate glass.

In some embodiments, the Verdet constant of the magnetically responsive light propagating component may be more than 50 rad/T·m.

In some embodiments, the concentration of gadolinium may be less than 1% by weight, optionally less than 0.9% by weight, optionally less than 0.8% by weight, optionally less than 0.7% by weight, optionally less than 0.6% by weight, optionally less than 0.5% by weight, optionally less than 0.4% by weight, optionally less than 0.3% by weight, optionally less than 0.2% by weight.

In some embodiments, the concentration of gadolinium may be less than 0.15% by weight, optionally less than 0.1% by weight.

In some embodiments, the gadolinium atoms may be uniformly dispersed at interstitial positions within a network of the bulk material.

In some embodiments, substantially all of the gadolinium atoms may be not clustered.

In some embodiments, the gadolinium atoms and bulk material network may be provided in a single, non-separated, phase of amorphous material.

In some embodiments, the magnetically responsive light propagating component may be an optical fiber.

In accordance with embodiments of the present disclosure, a magnetically responsive light propagating component is provided that, while being relatively cheap and straightforward to produce, relatively strongly exhibits the Faraday effect and so operates as a Faraday rotator, rotating the plane of linearly polarized light by an amount dependent on the magnetic field strength in the region of the component. As noted above, a material that acts as a Faraday rotator is one that rotates the azimuth of polarization of light propagating through the Faraday rotator. The interaction between the light and the magnetic field in the carrier medium is one in which the opposing components of circularly polarized light making up the linearly polarized light have different phase velocities in the medium due to the magneto-optic effect, which gives rise to a rotation of the angle of polarization of their linearly polarized superposition.

The degree of rotation of the polarization angle of linearly polarized light in the medium is linearly proportional to the component of the magnetic field in the direction of light propagation in that region of the fiber.

Figure 1:
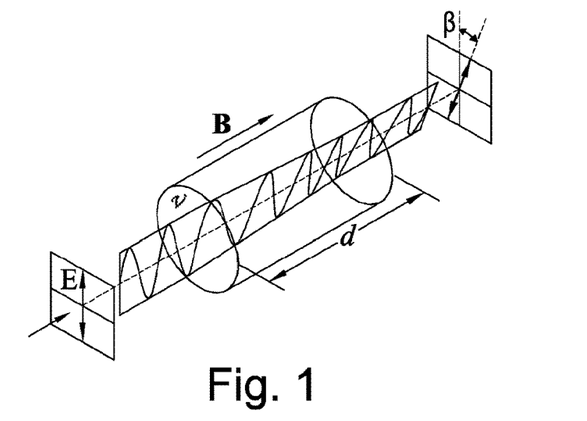
FIG. 1 illustrates the rotation of the polarization azimuth of a linearly polarized electromagnetic wave propagating through a magnetically responsive light propagating component, in accordance with the Faraday effect.

The amount of rotation in a Faraday rotator is defined using the Verdet constant. FIG. 1 shows an electromagnetic wave propagating through an optical medium of length d. The optical medium is in a magnetic field B, which causes a rotation ($\beta$) of the azimuth of the linear polarization of the electromagnetic wave over the length d. The Verdet constant (V) is defined as:

$$V = \frac{\beta}{Bd}$$

The Verdet constant of standard, non-doped silica fibers is small (~1.1 rad/(Tm) at a transmission wavelength 1064 nm), and so, as noted above, the fiber is usually coiled with multiple turns to increase the rotation of the polarization azimuth, increasing the size and complexity of the sensor.

A number of fiber compositions have been proposed to increase the Verdet constant, for example doping silica fibers with rare-earth dopants. Generally, the literature directs that a higher concentration of rare earth dopants leads to a higher Verdet constant. For example, in "Quantum Mechanics: The Key to Understanding Magnetism", J. H. Van Vleck, Science, 14 Jul. 1978: 113-120 it is stated that magnetic susceptibility increases with ion concentration, and accordingly it would be expected that the Verdet constant would increase with ion concentration.

As a result, improved Verdet constants have been reported as a result of using ever higher concentrations of rare-earth dopants. In the example given in the background, by using a dopant concentration of 65%, terbium (Tb) doped fibers have been demonstrated with a Verdet constant of ~32 rad/Tm, or ~30 times that of silica fibers (see "Compact all-fiber optical Faraday components using 65-wt %-terbium-doped fiber with a record Verdet constant of −32 rad/(Tm)," L. Sun, S. Jiang, and J. R. Marciante, Opt. Express 18, 12191-12196 (2010)). However, as noted above, these are difficult and expensive to manufacture, fiberize and integrate into low attenuation magnetic field sensors.

In contrast, the magnetically responsive light propagating component of the present disclosure is formed of a bulk material doped with a dopant, the dopant including at least gadolinium. The dopant concentration is at a sufficiently low concentration such that the dopant is uniformly dispersed in the bulk material to provide a high Verdet constant.

Figure 2:
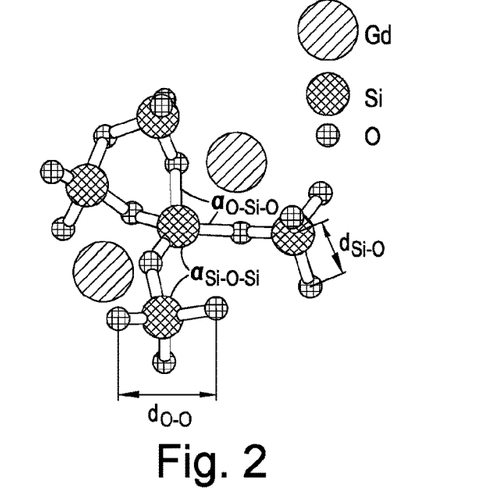
FIG. 2 illustrates the location of Gd dopant atoms at low concentration in interstitial positions in an amorphous silica network in accordance example embodiments of the disclosure.

When a bulk material, such as silica glass is doped with gadolinium at a sufficiently low concentration in accordance with present disclosure, the gadolinium is positioned in interstitial sites along the amorphous silica network, as illustrated in FIG. 2. Doping the bulk material of the magnetically responsive light propagating component with a low concentration of Gadolinium dopant unexpectedly leads to a high Verdet constant. A fiber doped with gadolinium in this way has a Verdet constant that is more than 100 times that of a conventional silica doped fiber, and at least 2 times that of a 65 wt % Tb doped fiber as referenced above.

Figure 3:
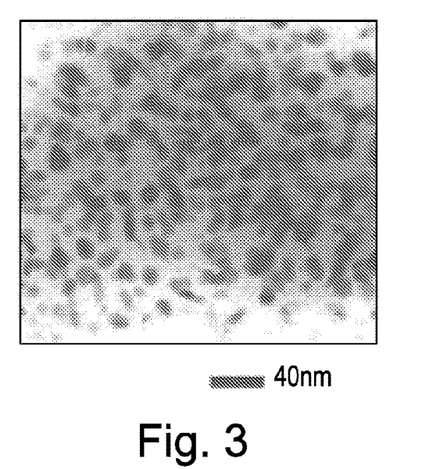
FIG. 3 is a transmission electron microscope (TEM) image of gadolinium doped silica glass showing phase separation and clustering of the Gd atoms at high concentrations of the dopant.

It is thought that this unexpected behavior can be explained because, in low concentrations, the gadolinium atoms are uniformly dispersed in the host material (e.g. the amorphous silica network), whereas at high concentrations the gadolinium atoms cluster together into a separate material phase. This phase separation that results from a high concentration of gadolinium dopant is shown in FIG. 3, which is a transmission electron microscope (TEM) image of gadolinium doped silica glass at high concentrations (Di Martino, Journal of Non-Crystalline Solids, Volume 354, Issue 32, 15 Aug. 2008, Page 3817) in which the gadolinium clusters or grains in the silica glass host are clearly visible. Gadolinium atoms residing in proximal positions in clusters (as opposed to dispersed locations) will have magnetic momentum pointing in opposite directions, resulting in an overall effectively zero magnetic momentum for the clusters with the magnetic effect of many of the dopant atoms being shielded. The magnetic momentum for the bulk material will then be the sum of only the gadolinium atoms whose magnetic momentum is not compensated by a neighboring gadolinium atom pointing in opposite direction—i.e. only gadolinium atoms which are not shielded.

In contrast, the low concentration of gadolinium in accordance with the present disclosure avoids phase separation that would result in the above detrimental effect for the Verdet constant. Further, the atomic spin of Gd is the strongest atomic spin in the table of elements and so, with the absence of clustering for low concentration Gd dopants, the magnetic effect of the dopant in the host material is further enhanced. The high Verdet constant of low concentration gadolinium doped bulk materials runs contrary to the previous expected behavior of rare-earth dopants, as it was expected that higher concentrations of rare earth dopants would lead to higher Verdet constants. Indeed, it has been surprisingly discovered that, to achieve a high Verdet constant the concentration of gadolinium may be less than 1% by weight (above which clustering tends to act against a high Verdet constant being achieved), and indeed, a concentration of gadolinium of less than 0.15% by weight may be desirable.

Thus, by using Gadolinium as a low concentration diffuse (non-clustered) dopant, a high Verdet constant can surprisingly be obtained in an easy-to-manufacture simple silica-based optical or fiber component, without having to rely on expensive-to-manufacture and handle rare earth crystals and bespoke fibers. The component can be easily deployed in an amorphous silica doped network material and can be easily fiberized and handled and spliced with low losses to enable a compact and cheap fiber-based magnetic field sensor to be provided.

A high Verdet constant is advantageous for magnetic field sensors, as it enables a shorter amount of the magnetically responsive light propagating component to be used, and also may allow for a less complex structure of the magnetic field sensor. This is because fewer, if any, turns of the magnetically responsive light propagating component will be required to achieve the same sensitivity delivered by a pure silica fiber-based sensor.

In some embodiments of the magnetic field sensor, the detection device may comprise an output-side polarizer aligned orthogonally to the polarization axis of the light coupled into the magnetically responsive light propagating component, and a photosensor configured to measure the intensity of light output from the polarizer. In this way, the intensity of the measured output light, or at least the variation in the intensity, is indicative of the magnetic field strength, or the variation thereof over time, in the region of the magnetically responsive light propagating component.

In some embodiments, the linearly polarized light source may comprise an input-side polarizer aligned orthogonally to the polarization axis of the output-side polarizer, and a light source arranged to couple light into the input-side polarizer. This ensures that output light intensity should be zero absent a significant magnetic field.

In some embodiments, the detection device may comprise a balanced photodetector having two ports, the balanced photodetector arranged to provide an output signal indicative of a difference in light intensity input into the two ports; the magnetic field sensor may further comprise a polarization maintaining coupler arranged to split light from the linearly polarized light source, wherein one leg of the polarization maintaining coupler is coupled to the magnetically responsive light propagating component, the output of which is coupled to one of the ports of the balanced detector, wherein the other leg of the polarization maintaining coupler is coupled to another one of the ports of the balanced detector. Balanced detection provides an effective mechanism to measure the rotation of the azimuth of polarization in the magnetically responsive light propagating component.

In some embodiments, the linearly polarized light source may be configured to generate a pulsed light signal and the detector is configured to perform time-of-flight measurements to reveal information about the variation in the magnetic field applied along the length of the magnetically responsive light propagating component. In this way, information can be revealed about the passage of the pulses along the magnetically responsive light propagating component, and about the magnetic field in the magnetically responsive light propagating component.

In some embodiments, the length of the magnetically responsive light propagating component may be less than 2 m, optionally less than 1.5 m, optionally less than 1 m, optionally less than 0.5 m. In this way, a compact magnetic field sensor can be provided.

The present application discloses, in example embodiments, a system of distributed magnetic field sensors comprising a plurality of magnetically responsive light propagating components arranged to provide distributed measurements of a magnetic field over a distance of at least 100 m. In some embodiments, the plurality of magnetically responsive light propagating components may be optically coupled. In this way, the magnetically responsive light propagating component of the present disclosure can be used to perform distributed polarimetry to reveal information about the magnetic field over a wide area.

The present application discloses, in example embodiments, an optical device providing non-reciprocal transmission of light comprising: at least two optical ports, each arranged to allow light to be coupled into and out of the device; the magnetically responsive light propagating component optically coupled between two of the optical ports; at least one linear polarizer arranged between a first one of the ports and the magnetically responsive light propagating component; wherein the magnetically responsive light propagating component is arranged to cause the polarization of light propagating through it to be rotated by 45 degrees by the Faraday effect, such that light entering through the first one of the ports is rotated by 45 degrees on exit from the device at the second one of the ports and if reflected back into the second one of the ports, leaves the magnetically responsive light propagating component orthogonally polarized compared to light entering the device from the first one of the ports. In this way, the magnetically responsive light propagating component of the present disclosure can be used to provide non-reciprocal optical device.

In some embodiments, the optical device may be arranged as an optical isolator, such that the polarizer is arranged to block the transmission of the reflected orthogonally polarized light back through the first one of the ports. A second linear polarizer may be provided between the magnetically responsive light propagating component and the second port, orientated 45 degrees to the polarizer at the first one of the ports.

In some embodiments, the optical device may be arranged as an optical circulator and further comprises a third one of the ports and polarization-dependent optical redirection means arranged to redirect the reflected orthogonally polarized light through the third one of the ports.

In this way, the Gd-doped magnetically responsive light propagating component can be configured to provide an optical isolator and an optical circulator. In particular, a low cost fiber-based optical isolator is of significant utility for avoiding damage and disruption to a laser cavity by preventing laser light injected into an optical system from being reflected back into the cavity where it would otherwise create negative feedback in the laser. Where fiberized in Gd-doped silica fibers, a low cost fiber-based optical isolator and circulator can be provided.

The present application discloses, in example embodiments, an optical device providing non-reciprocal transmission of light comprising: two optical ports, each arranged to allow light to be coupled into and out of the device; a magnetically responsive light propagating component optically coupled between two of the optical ports; a mirror arranged to reflect light exiting from one of the ports back into the port; wherein the magnetically responsive light propagating component is arranged to cause the polarization of light propagating through it to be rotated by 45 degrees by the Faraday effect, such that linearly polarized light input through the other one of the ports is returned as an output of that port orthogonally polarized compared to the input linearly polarized light.

Similarly, the Gd-doped magnetically responsive light propagating component can be configured to provide a Faraday mirror. The mirror may be a Bragg grating, or where the fibers are used, the mirror may be a fiber Bragg grating.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

Certain example embodiments of the present disclosure will now be described with reference to the drawings, in which.

DETAILED DESCRIPTION OF THE INVENTION

Figure 4:
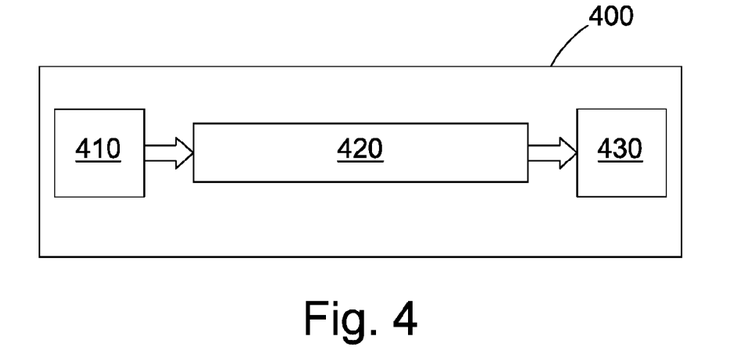
FIG. 4 illustrates a magnetic field sensor in accordance with some embodiments of the disclosure.

Referring to FIG. 4, a magnetically responsive light propagating component 420 in accordance with embodiments of the disclosure will now be described. Specifically, the magnetically responsive light propagating component 420 will be described in the context of its use in a magnetic field sensor 400 in accordance with some embodiments of the present disclosure.

The magnetic field sensor 400 comprises a magnetically responsive light propagating component 420 configured to cause a polarization azimuth of light propagating inside the component to be rotated in response to an applied magnetic field, as illustrated in FIG. 1. The magnetically responsive light propagating component 420 is formed of a bulk material doped with a dopant, the dopant including at least gadolinium. In the embodiment, the magnetically responsive light propagating component 420 is configured as a waveguide, specifically as an optical fiber of any suitable construction. In other embodiments however, the magnetically responsive light propagating component 420 may be configured as a bulk free space optical component (i.e. not configured to act as a waveguide in any direction).

The dopant concentration is at a sufficiently low concentration such that the dopant is uniformly dispersed in the bulk material to provide a high Verdet constant. In the embodiment, the bulk material of the fiber consists of silica, formed as an amorphous silica network, and the dopant consists essentially of Gadolinium. In the embodiment, the dopant is present in a concentration no greater than 0.15% by weight. In the embodiment, substantially all of the gadolinium atoms are uniformly dispersed at interstitial positions within a network of the bulk material as illustrated in FIG. 2, and substantially all of the gadolinium atoms may be not clustered, unlike the material shown in FIG. 3. That is, in the embodiment, the gadolinium atoms and bulk material network may be provided in a single, non-separated, phase of amorphous material. While in preferred embodiments, the dopant within the bulk material desirably consists exclusively of Gadolinium, in practice, by indicating herein that the dopant consists, or consists essentially of Gadolinium, it is to be understood that it is not excluded that further components may be present in the bulk material in addition to the Gadolinium (for example in trace amounts) incidentally or intentionally, but that the further components do not materially affect the rotation characteristics of the magnetically responsive light propagating component. Any such additional components in the bulk material magnetically responsive light propagating component 420 provided in addition to the Gadolinium may be provided to achieve an additional, non-polarization rotating, effect.

While in the embodiment, the dopant concentration of gadolinium is 0.15% by weight, but in other embodiments, more generally, the dopant concentration of gadolinium is less than 1.0% by weight or less. Further, while in the embodiment, the bulk material is amorphous silica (i.e. SiO2 formed as a glassy network, as in a fused silica or fused quartz glass), in some embodiments the bulk material comprises at least one of a crystalline silica material, or of bulk material provided by other oxide and non-oxide glasses or crystals such as silicon, germanium, bismuth, chalcogens.

Referring again to FIG. 4, the magnetic field sensor 400 comprises, in addition to the magnetically responsive light propagating component 420, a linearly polarized light source 410 arranged to couple the light into the magnetically responsive light propagating component, and a detector 430 arranged to receive light output from the magnetically responsive light propagating component. As indicated above, the Gd-doped magnetically responsive light propagating component 420, due to its high Verdet constant, acts as a Faraday rotator to cause the polarization of the linearly polarized light propagating inside the component 420 to be rotated in response to an external magnetic field applied to the magnetic field sensor 400. Due to its high Verdet constant, the length of the magnetically responsive light propagating component 420 may be short, or at least significantly shorter that an equivalent silica-fiber based magnetic field sensor. In embodiments, the length of the magnetically responsive light propagating component 420 is less than 2 m.

The detector 430 is configured to measure a property of light output from the magnetically responsive light propagating component 420 to determine a change in polarization of the light inside the magnetically responsive light propagating component 420, the change caused by the presence of an externally applied magnetic field. In the embodiment, the detector 430 comprises an output-side polarizer aligned orthogonally to the polarization axis of the light coupled into the magnetically responsive light propagating component 420 by the linearly polarized light source, and a photosensor configured to measure the intensity of light output from the polarizer.

In the embodiment, the linearly polarized light source 410 comprises an input-side polarizer aligned orthogonally to the polarization axis of the output-side polarizer, and a light source, such as a laser or a light emitting diode (LED), arranged to couple light into the input-side polarizer. The linearly polarized light source 410 and the detector 430 are configured to allow the polarization change in the magnetically responsive light propagating component 420 to be determined. As the linearly polarized light is input into the magnetically responsive light propagating component 420 at an angle orthogonal to the output-side polarizer, absent an externally applied magnetic field, the polarization angle of the light would not rotate in the magnetically responsive light propagating component 420, and so the light would be blocked by the output-side polarizer, meaning that the detector 430 would not detect light output from the magnetically responsive light propagating component 420 with any intensity. On the other hand, as an external magnetic field begins to be applied to the magnetically responsive light propagating component 420, the polarization angle of the linearly polarized light in the magnetically responsive light propagating component 420 would rotate, meaning that a component of the light would pass through the output-side polarizer and would be detected by the detector 430. Thus the intensity of the light detected by the detector 430 is indicative of a change in polarization of the light, and thus the change caused in the applied magnetic field.

Thus, the magnetic field sensor 400 may be used in a method of detecting a magnetic field in which polarized light is first received into the magnetically responsive light propagating component 420. The linearly polarized light may be provided by linearly polarized light source 410 and be coupled therefrom into the magnetically responsive light propagating component 420. Then, a property of light output from the magnetically responsive light propagating component 420 is detected to determine a change in polarization of the polarized light. The change in polarization being due to a magnetic field applied along the length of the magnetically responsive light propagating component.

In other embodiments, other suitable arrangements for the detector 430 may be provided that are configured to measure a property of light output from the magnetically responsive light propagating component 420 to determine a change in polarization of the light at the detector. Indeed, the linearly polarized light source 410, magnetically responsive light propagating component 420 and the detector 430 may all be configured such that a property of the light (other than its intensity) output from the magnetically responsive light propagating component 420 indicates a change in polarization of the light, the change caused by the presence of a magnetic field.

In embodiments the detector 430 may be provided as a balanced detector. In these embodiments, the detector 430 may comprise a balanced photodetector having two ports. The balanced photodetector is arranged to provide an output signal indicative of a difference in light intensity input into the two ports. Where a balanced detector is used, the magnetic field sensor 400 may further comprise a polarization maintaining coupler arranged to split light from the linearly polarized light source 410. One leg of the polarization maintaining coupler is coupled to the magnetically responsive light propagating component 420, the output of which is coupled to one of the ports of the balanced detector. The other leg of the polarization maintaining coupler is coupled to another one of the ports of the balanced detector. In this way, the balanced photodetector can be used to generate a signal based on a difference in a property of the light received at the two ports, the signal being indicative of the rotation of the polarization of the light in the magnetically responsive light propagating component 420, and thus revealing the effect of the applied magnetic field.

In embodiments, the detector 430 may comprise an interferometer. In some embodiments, the magnetically responsive light propagating component 420 may be configured to receive a pulsed signal, and the detector may be configured to perform time of flight measurements. Time of flight measurements allow the sensor to be used as a distributed sensor, where the location or locations of the magnetic field may be identified.

The magnetically responsive light propagating component 420 can be fabricated by any suitable process for producing doped optical components that provide a low Gd-doped bulk material with a high Verdet constant. Two example fiber-based Gd-doped silica magnetically responsive light propagating components 420 in accordance with the embodiments were fabricated by the two methods as described below.

Example 1

A sol gel cylinder was tapered on a drawing tower and then inserted in a fluorosilicate tube with a suitable inner to outer diameter ratio before being pulled into a fiber using the rod in tube technique. The fiber was doped with 0.15% by weight of gadolinium.

Example 2

A phosphosilicate soot was deposited inside a high grade silica tube by the modified chemical vapor deposition (MCVD) and then doped with gadolinium ions by solution doping. After consolidation and collapse, the preform was pulled into a fiber with a dopant of 0.15% by weight of gadolinium.

Both fibers from the above examples were tested by arranging them as the magnetically responsive light propagating component 420 in a magnetic field sensor 400 as described above. A tunable 1550 nm fiberized laser source was used as the linearly polarized light source 410 and a balanced detector was used as the detector 430. Light from the tunable laser source was launched into a polarizer before being split by a polarization maintaining coupler, as described above in relation to the balanced detector implementation. One of the arms of the coupler constituted the reference and was directly connected to a port of a balanced detector. The other arm was spliced to the fiber under test which was inserted in a magnetic field generator capable of generating longitudinal magnetic fields of the order of 1T. The powers recorded at the balanced power meter were monitored in real time and used to determine the rotation of the polarization azimuth. The strength of the magnetic field was measured using a magnetometer and the interaction length was measured with a meter.

As a control, a single mode telecom fiber was used in place of the above Gd-doped fibers as a reference. The calculated Verdet constant value of the silica-based single mode telecom fiber resulted to be within 20% of the values published in the literature. The value of the Verdet constant of the gadolinium-doped fiber in accordance with embodiments of this disclosure was calculated as a ratio with respect to the value of the terrestrial telecom fiber and the Verdet constant of the embodiment of the disclosure was found to be around 100 times larger than that measured in the telecom fiber. Thus the embodiments of the present disclosure provide a magnetically responsive light propagating component 420 having a high Verdet constant, enabling a sensitive and compact magnetic field sensor to be economically and simply produced, and with the magnetically responsive light propagating component 420 being easily integrated with and spliced with other optical components.

Further, the fibers of the above embodiments provide a magnetically responsive light propagating component 420 having total losses significantly lower than the Terbium-doped fiber-based magnetic field sensors in the art. Measured values of attenuation in the infrared region at 1550 nm as low as 4.739 dB/km were achieved for the Gd-doped fibers fabricated as described above, as measured using an Optical Side Scattering Radiometry (OSSR) technique over a 30 m stretch of fiber. However, as the concentration of the rare earth dopant is extremely small and not absorbing in the visible, near UV region, a loss as low as 1 dB/km can be expected. For comparison, the attenuation of normal telecom fiber is 0.15 dB/km. Considering that the length of the Gd-doped fiber that would need to be employed would be significantly shorter than an equivalent standard silica fiber-based magnetic field sensor (100× shorter for the same sensitivity, due to the difference in the Verdet constant), it will be appreciated that the losses over the sensitive length of the magnetically responsive light propagating component 420 would be very small. Indeed the ratio of the Verdet constant to the attenuation for the Gd-doped fibers of the disclosure is significantly higher than that for standard silica fibers and for the Tb-doped fibers indicated above. Further, unlike with the Tb-doped fibers, as the Gd-doped fiber is easily spliced, coupling losses from splicing are negligible.

By combining a plurality of magnetically responsive light propagating components 420 arranged to provide distributed measurements of a magnetic field, a system of distributed magnetic field sensors 400 may be provided. A plurality of the magnetically responsive light propagating components 420 of the system may share one or more light sources 410 and/or detectors 430, or they may each have individual light sources 410 and/or detectors 430. The light sources 410 and/or detectors 430 may be controlled to detect the magnetic field over a distance of at least 100 m. The plurality of magnetically responsive light propagating components may be optically coupled.

Besides being used for magnetic field sensing, the magnetically responsive light propagating components of the present disclosure may also be used to provide non-reciprocal optical components, for example optical isolators, optical circulators, and Faraday mirrors. These components may be fully fiberized and compact.

Figure 5A:
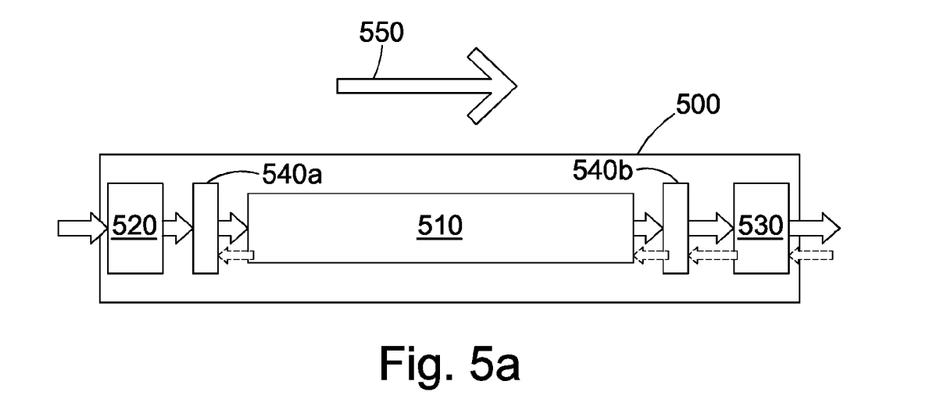
FIG. 5a illustrates an optical isolator in accordance with some embodiments of the disclosure.

FIG. 5 illustrates an optical isolator 500 according to an embodiment of the disclosure, in which a Gd-doped magnetically responsive light propagating component provides the non-reciprocal optical component. The optical isolator 500 comprises two optical ports 520, 530, arranged to allow light to be coupled into and out of the device. The optical port 520 is usable as an optical input to the isolator. The optical port 530 is usable as an optical output to the isolator. The optical component also comprises a first polarizer 540a and a second polarizer 540b arranged in an optical path between a Gd-doped magnetically responsive light propagating component 510 in accordance with the disclosure. The magnetically responsive light propagating component 510 and at least first and second polarizers 540a, 540b are arranged to enforce unidirectional transmission of light between the at least one input 520 and the at least one output 530. This may be realized by arranging the first optical polarizer 540a to be vertically polarizing, and the second polarizer 540b to be a 45° polarizer. The magnetically responsive light propagating component 510 is arranged to rotate the polarization of light propagating through the magnetically responsive light propagating component 510 by +45°. This means that light input at optical 520 will be vertically polarized by polarizer 540a and then be rotated to 45° polarization by the magnetically responsive light propagating component. This means that the light travelling in direction 550 will pass through polarizer 540b without being substantially attenuated. Any light that is reflected at the output 530 or at the polarizer 530 (as indicated by the dotted lines) will propagate through light propagation component 510, and therefore be changed to horizontally polarized light. This is because the rotation of the light by a Faraday rotator is independent of direction of propagation direction. It is also noted that any light that is input at output 530 will have its polarization changed to 45° by polarizer 540b, and therefore if it propagates through magnetically responsive light propagating component 510 it will also be rotated by +45° such that it is horizontally polarized. Therefore, any light propagating opposite to direction 550 will be cross-polarized with respect to polarizer 540a and therefore will be blocked by polarizer 540a. This type of polarizer is a polarization dependent polarizer.

The polarizers 540a and 540b are not limited to being vertically and 45° polarized respectively. In some embodiments the angle between the polarizers 540a and 540b may be +45°, and the magnetically responsive light propagating component 510 may be configured to rotate the polarization of light by +45° when propagating in direction 550.

A polarization independent isolator may also be produced according to some embodiments of the invention. The polarization independent isolator may comprise three parts, an input birefringent wedge (with its ordinary polarization direction vertical and its extraordinary polarization direction horizontal), a magnetically responsive light propagating component, and an output birefringent wedge (with its ordinary polarization direction at 45°, and its extraordinary polarization direction at)−45°.

Light traveling in the forward direction is split by the input birefringent wedge into its vertical (0°) and horizontal (90°) components, called the ordinary ray (o-ray) and the extraordinary ray (e-ray) respectively. The magnetically responsive light propagating component rotates both the o-ray and e-ray by 45°. This means the o-ray is now at 45°, and the e-ray is at −45°. The output birefringent wedge then recombines the two components.

Light traveling in the backward direction is separated into the o-ray at 45°, and the e-ray at −45° by the birefringent wedge. The Faraday Rotator again rotates both the rays by 45°. Now the o-ray is at 90°, and the e-ray is at 0°. Instead of being focused by the second birefringent wedge, the rays diverge. In some embodiments collimators may be used on either side of the isolator. In the transmitted direction the beam is split and then combined and focused into the output collimator. In the isolated direction the beam is split, and then diverged, so it does not focus at the collimator.

Figure 5B:
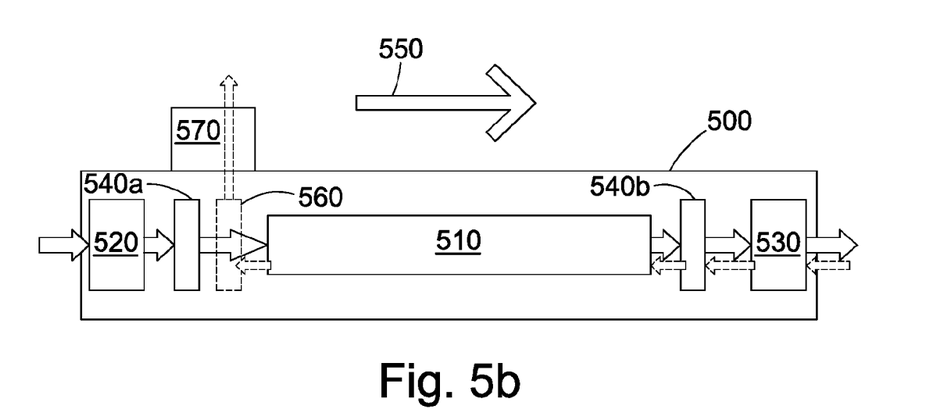
FIG. 5b illustrates an optical circulator in accordance with some embodiments of the disclosure.

An optical circulator 500c may also be provided, as shown in FIG. 5b, by adapting the isolator 500 providing a polarization-dependent optical redirection means 560 arranged to redirect the reflected orthogonally polarized light (as indicated by the dotted lines) through a third port 570. This is such that light entering the circulator 500c at the first port 520, leaves the circulator at the second port 530, and that light entering the circulator 500c at the second port 530, leaves the circulator at the third port 570.

In another adaptation to the isolator 500, a Faraday mirror may be provided by removing the polarizers 540a and 540b and by providing a mirror at or after the output at the second port 530, such that all light exiting the Faraday mirror at the second port is reflected back into the second port 530. As a result of this arrangement, all linearly polarized light entering the Faraday mirror at the first port 520 will be reflected back out of the first port 520 having been rotated to an orthogonal polarization.

As the Gd-doped magnetically responsive light propagating components can be formed as easily handled and spliced fiber, this enables the above non-reciprocal optical components to be provided as compact fiber-based devices.

What is claimed is:

1. A magnetically responsive light propagating component configured to cause a polarization of light propagating inside the component to be rotated in response to an applied magnetic field, wherein the magnetically responsive light propagating component comprises a bulk material doped with a dopant at a dopant concentration, the dopant including at least gadolinium, the dopant concentration being at a sufficiently low concentration such that the dopant is uniformly dispersed in the bulk material to provide a Verdet constant greater than 50 rad/T·m.

2. The magnetically responsive light propagating component of claim 1, wherein the dopant consists of gadolinium.

3. The magnetically responsive light propagating component of claim 1, wherein the bulk material consists of amorphous fused silica.

4. The magnetically responsive light propagating component of claim 1, wherein the bulk material consists of at least one of: germanosilicate, aluminosilicate, flurosilicate, or phosphosilicate glass.

5. The magnetically responsive light propagating component of claim 1, wherein the dopant concentration of gadolinium is less than 1% by weight.

6. The magnetically responsive light propagating component of claim 5, wherein the dopant concentration of gadolinium is less than 0.15% by weight.

7. The magnetically responsive light propagating component of claim 1, wherein the gadolinium atoms are dispersed at interstitial positions within a network of the bulk material.

8. The magnetically responsive light propagating component of claim 7, wherein the gadolinium atoms and network of the bulk material are provided in a single, non-separated, phase of amorphous material.

9. The magnetically responsive light propagating component of claim 1, wherein the magnetically responsive light propagating component comprises an optical fiber.

10. A magnetic field sensor comprising:
a linearly polarized light source;
the magnetically responsive light propagating component of claim 1, the magnetic field sensor being arranged so that, in use, linearly polarized light from the linearly polarized light source is coupled into the magnetically responsive light propagating component, the magnetically responsive light propagating component acting as a Faraday rotator to cause the polarization of the linearly polarized light propagating inside the component to be rotated in response to an applied magnetic field; and
a detection device arranged to receive light output from the magnetically responsive light propagating component;
wherein the detection device is configured to measure a property of light output from the magnetically responsive light propagating component to indicate a change in polarization of the light, the change caused by the presence of a magnetic field.

11. The magnetic field sensor of claim 10, wherein the detection device comprises an output-side polarizer aligned orthogonally to the polarization axis of the light coupled into the magnetically responsive light propagating component, and a photosensor configured to measure the intensity of light output from the polarizer.

12. The magnetic field sensor of claim 11, wherein the linearly polarized light source comprises an input-side polarizer aligned orthogonally to the polarization axis of the output-side polarizer, wherein the linearly polarized light source is arranged to couple light into the input-side polarizer.

13. The magnetic field sensor of claim 10, wherein the detection device comprises a balanced photodetector having two ports, the balanced photodetector arranged to provide an output signal indicative of a difference in light intensity input into the two ports;
the magnetic field sensor further comprising a polarization maintaining coupler arranged to split light from the linearly polarized light source into a first leg and a second leg, wherein the first leg of the polarization maintaining coupler is coupled to the magnetically responsive light propagating component, an output of which is coupled to one of the ports of the balanced detector, wherein the second leg of the polarization maintaining coupler is coupled to another one of the ports of the balanced detector.

14. The magnetic field sensor of claim 10, wherein the linearly polarized light source is configured to generate a pulsed light signal and the detector is configured to perform time-of-flight measurements to reveal information about the variation in the magnetic field applied along the length of the magnetically responsive light propagating component.

15. The magnetic field sensor of claim 10, wherein the length of the magnetically responsive light propagating component is less than 2 m.

16. A method of detecting a magnetic field, the method comprising:
receiving polarized light into the magnetically responsive light propagating component of claim 1;
detecting a property of light output from the magnetically responsive light propagating component to determine a change in polarization of the polarized light, the change in polarization being due to a magnetic field applied along the length of the magnetically responsive light propagating component.

17. An optical device providing non-reciprocal transmission of light, the optical device comprising:
at least two optical ports, each arranged to allow light to be coupled into and out of the device;
the magnetically responsive light propagating component of claim 1 optically coupled between two of the optical ports;
at least one linear polarizer arranged between a first one of the ports and the magnetically responsive light propagating component;

wherein the magnetically responsive light propagating component is arranged to cause the polarization of light propagating through it to be rotated by 45 degrees by the Faraday effect, such that light entering through the first one of the ports is rotated by 45 degrees on exit from the device at the second one of the ports and if reflected back into the second one of the ports, leaves the magnetically responsive light propagating component orthogonally polarized compared to light entering the device from the first one of the ports.

18. The optical device of claim 17, wherein the optical device is arranged as an optical isolator, such that the polarizer is arranged to block the transmission of the reflected orthogonally polarized light back through the first one of the ports.

19. The optical device of claim 17, wherein the optical device is arranged as an optical circulator and further comprises a third one of the ports and polarization-dependent optical redirection means arranged to redirect the reflected orthogonally polarized light through the third one of the ports.

20. An optical device providing non-reciprocal transmission of light comprising:
   two optical ports, each arranged to allow light to be coupled into and out of the device;
   the magnetically responsive light propagating component of claim 1 optically coupled between two of the optical ports;
   a mirror arranged to reflect light exiting from one of the ports back into the port;
   wherein the magnetically responsive light propagating component is arranged to cause the polarization of light propagating through it to be rotated by 45 degrees by the Faraday effect, such that linearly polarized light input through the other one of the ports is returned as an output of that port orthogonally polarized compared to the input linearly polarized light.

* * * * *